United States Patent [19]
Leisten et al.

[11] Patent Number: 5,832,375
[45] Date of Patent: Nov. 3, 1998

[54] SUPERHETERODYNE RADIO RECEIVER

[75] Inventors: Oliver P. Leisten, Northampton; Raymond J. Hasler, Northants, both of England

[73] Assignee: SymmetriCom, Inc., San Jose, Calif.

[*] Notice: The term of this patent shall not extend beyond the expiration date of Pat. No. 5,606,736.

[21] Appl. No.: 748,348

[22] Filed: Nov. 14, 1996

Related U.S. Application Data

[63] Continuation of Ser. No. 336,794, Nov. 9, 1994, Pat. No. 5,606,736, which is a continuation of Ser. No. 913,291, Jul. 14, 1992, abandoned.

[30] Foreign Application Priority Data

Jul. 16, 1991 [GB] United Kingdom .................. 9115350

[51] Int. Cl.$^6$ ..................................... H04B 1/26
[52] U.S. Cl. ................... 455/314; 455/196.1; 455/260
[58] Field of Search .................... 455/314, 315, 455/318, 319, 334, 22, 207, 196.1, 197.1, 197.2, 258, 259, 260, 76

[56] References Cited

U.S. PATENT DOCUMENTS

| | | | |
|---|---|---|---|
| 4,262,361 | 4/1981 | Hauer | 455/315 X |
| 4,580,289 | 4/1986 | Enderby | 455/260 X |
| 5,040,240 | 8/1991 | Keegan | 455/315 X |
| 5,220,684 | 6/1993 | Suizu | 455/196.1 X |
| 5,220,688 | 6/1993 | Tao | 455/314 |
| 5,606,736 | 2/1997 | Hasler et al. | 455/196.1 X |

*Primary Examiner*—Wellington Chin
*Assistant Examiner*—Philip J. Sobutka
*Attorney, Agent, or Firm*—Mark A. Haynes; Wilson, Sonsini, Goodrich & Rosati

[57] ABSTRACT

A satellite navigation receiver uses common dual-conversion superheterodyne and frequency synthesiser circuitry for receiving signals from both the GPS and the GLONASS satellite navigation systems. Successive first and second frequency down-converters in the receiver chain are fed by first and second local oscillator signals which are both variable in frequency such that the frequency of the first local oscillator signal is an integral multiple (preferably 8) of the second local oscillator signal. This relationship is provided by a binary divider (32) at least a portion of which may form part of a digital frequency synthesiser loop.

22 Claims, 1 Drawing Sheet

SUPERHETERODYNE RADIO RECEIVER

This is a continuation of application Ser. No. 08/336,794 filed on Nov. 9, 1994 U.S. Pat. No. 5,606,736, which is a continuation of application Ser. No. 07/913,291 filed on Jul. 14, 1992, which is now abandoned.

FIELD OF THE INVENTION

This invention relates to a radio receiver, and in particular to a receiver for satellite navigation and position-fixing.

BACKGROUND OF THE INVENTION

The American GPS (Global Positioning System) and the Soviet GLONASS system are both satellite-based position-fixing systems using a number of earth orbiting satellites. Although each is capable of providing a high level of position-fixing accuracy neither is capable of a grade of certainty and coverage to satisfy the needs of the most demanding of applications, such as those of the civil aviation business, in which satellite navigation receivers are used only as "secondary navigation aids". However, use of both systems together gives a much higher grade of certainty since one system can be used to check the other.

The GPS civil position-fixing service makes use of signals transmitted by a number of satellites on a common carrier frequency (LI) of 1575.42 MHz. Since each GPS satellite transmits a unique modulation code it is possible for a single receiver, tuned to the common carrier frequency, to extract data separately from the transmissions of each satellite. In contrast, the GLONASS service has satellites transmitting signals on different frequencies with a common code modulation scheme. Currently, the L1 group of channels comprises 24 channels in the range 1602.5625 MHz to 1615.5000 MHz.

Naturally, it is possible to equip users each with one GPS receiver and one GLONASS receiver, or to build a receiver with largely separate frequency synthesiser and intermediate frequency stages for GPS and GLONASS, but both approaches are costly in comparison with the provision of a single GPS receiver, for example.

It is an object of the present invention to produce a receiver which is capable of receiving signals from different transmission systems having substantially unrelated frequency characteristics and which uses common components for receiving the signals from the different systems to reduce cost.

SUMMARY OF THE INVENTION

According to this invention, there is provided a superheterodyne radio receiver having at least two successive frequency down-converters arranged to be fed by respective local oscillator signal sources, wherein, for tuning the receiver to different frequencies, the frequencies of the said sources are variable and related by the expression $f_{L01}= X.f_{L02}$, where $F_{L01}$ and $f_{L02}$ are the frequencies of a first and a second of the said sources respectively, and X is a fixed integer in at least one mode of the receiver.

The local oscillator signal sources may be provided by a single frequency synthesiser, the second source being formed by the output of a digital frequency divider which has an input associated with the first source. The frequency divider may be a fixed division ratio part of a variable divider chain linking an electrically controlled oscillator and a phase or frequency comparator for comparing the output of the divider chain with a signal the frequency of which is governed by a reference oscillator operable at a reference oscillator frequency. The receiver frequency may be variable in a series of regular frequency increments corresponding to the predetermined frequency spacing of a series of transmission channels, with the frequency $f_{L02}$ of the second source varying in a series of corresponding increments $f_{L02}$ each equal to a factor (preferably, the highest factor) common to the frequency spacing and the reference oscillator frequency.

In the case of a receiver operable at UHF frequencies or higher, such as a satellite navigation receiver for receiving satellite signals in L-band, the divider determining the ratio (X) between the frequencies of the first and second local oscillator signal sources is advantageously a binary divider. In the particular dual conversion embodiments of the invention to be described below the ratio (X) is 8 in at least one mode of the receiver. This figure is chosen because, firstly, a convenient reference frequency for satellite navigation receivers is 10 MHz (or a multiple thereof), and the highest common factor of 10 MHz and the GLONASS channel spacing (for the L1 channels) of 0.5625 MHz is 62.5 KHz, and secondly, the ratio X is determined by the relationships:

$$f_{L01}+f_{L02}=f$$

and $f_{L01}=f.X/(X+1)$ yielding $X=(f/f_{L02})-1$ where $f_{L01}$ and $f_{L02}$ are the frequency increments of the variable local oscillator frequencies and f is the frequency increment of the input frequency of the receiver (i.e the channel spacing, so that, putting $f_{L02}=62.5$ KHz and f=0.5625 MHz, it is seen that X=8.

DETAILED DESCRIPTION OF PREFERRED EMBODIMENTS OF THE INVENTION

Figure 1:
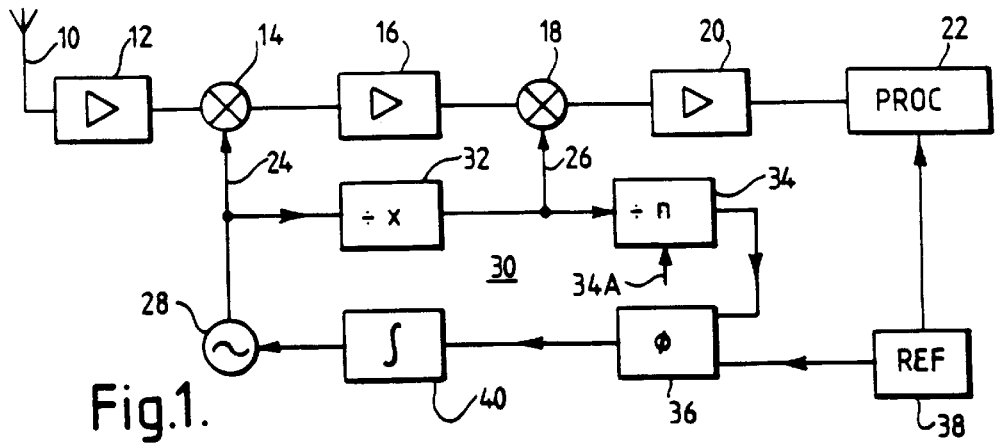
FIG. 1 is a block diagram of a first ratio receiver in accordance with the invention.

It has been stated above that a satellite navigation receiver for GLONASS signals can be produced using a reference oscillator of 10 MHz or a multiple of 10 MHz by employing a double-conversion superhet signal chain in which the two down-converters are fed with local oscillator signals the frequencies of which are in the ratio of 8 to 1. Referring to FIG. 1, such a receiver may comprise an antenna 10, an input filtering and amplifying stage 12, a first mixer 14, a first intermediate frequency (i.f) filtering and amplifying stage 16, a second mixer 18, a second i.f filtering and amplifying stage 20, and signal detection and processing circuitry 22. First and second local oscillator signals are fed to the first and second mixers 14, 18 respectively on lines 24 and 26, the source of the first local oscillator signal being a voltage controlled oscillator (VCO) 28 forming part of a frequency synthesiser loop 30. Control of the VCO frequency is established in conventional manner by means of a digital frequency divider chain 32, 34 feeding a phase comparator 36 which also receives a reference signal derived from a reference frequency source 38. The output of the phase comparator 36 is integrated in a low-pass filter stage 40 and applied to the control voltage input of the VCO 28.

In the present case the divider chain includes, firstly, a fixed divider 32 which acts as a prescaler for dividing the VCO frequency by a constant integer X and, secondly, a variable divider 34 for further division by a variable number n according to settings signalled via control input 34A. Coupled to the output of the fixed divider 32 is the local oscillator input of the second mixer 18 so that the second local oscillator frequency $f_{LO2}$ is equal to $f_{LO1}$ divided by X, X being 8 in this example.

The GLONASS satellite navigation system currently transmits signals on 24 channels between 1602.5625 MHz and 1615.5000 MHz separated by increments of 0.5625 MHz. These are often referred to as the GLONASS "L1" channels, 24 out of 32 channel allocations actually being used at present. Conventionally, in a single loop frequency synthesiser for a receiver receiving such signals, a comparison frequency (at the phase comparator) of 0.5625 MHz might be chosen to allow switching between channels by altering the division ratio of the variable divider in increments of 1, and to give adequate synthesiser response speed and noise performance. However, such a comparison frequency cannot be obtained by direct division from a reference crystal oscillator running at 10 MHz, 20 MHz or, perhaps, 40 MHz. These frequencies are convenient for use in GPS satellite navigation receivers due to the speed requirements of the processing circuitry and the ease with which a calendar time reference can be generated for predictive acquisition of satellite signals. Indeed, stages such as frequency multipliers or non-linear mixers are required, together with filters for blocking unwanted frequency components, which are expensive in relation to dividers and, in the case of filters particularly, are difficult to incorporate in integrated circuit devices.

Instead, the receiver of FIG. 1 uses a comparison frequency of 62.5 KHz, which is the highest common factor of 10 MHz and the channel spacing 0.5625 MHz. By selecting a division ratio of 8 for the fixed divider 32 and taking the output of that fixed divider as the local oscillator input for the second mixer, it will be seen that the receiver can be tuned to the 24 GLONASS channels by altering the division ratio n of the variable divider 34 in steps of 1, and by dividing the reference frequency 10 MHz in a reference divider (not shown in FIG. 1) by 160, i.e without frequency multipliers or other complex components.

In terms of precise frequencies and division ratios, the frequency synthesiser may be arranged to produce first and second local oscillator frequencies of 1402.0 MHz and 175.25 MHz respectively to receive channel 1 (1602.5625 MHz), yielding a first i.f of 200.5625 MHz and a second i.f of 25.3125 MHz. The division ratio n is 2804. Changing the division ratio n to 2827 produces first and second local oscillator frequencies of 1413.5 MHz and 176.6875 MHz for receiving channel 24 (1615.5000 MHz). The second i.f remains constant at 25.3125 MHz. It will be noted now that the first i.f has changed to 202.0000 MHz. In fact, as the receiver is tuned from channel to channel, the first i.f frequency changes in steps of 62.5 KHz together with the second local oscillator frequency. A change of first i.f frequency of this order is acceptable and can be accommodated within the first i.f filter bandwidth. It will also be noted that the first local oscillator frequency is incremented in steps of 0.5 MHz, i.e 8 times the increments of the second local oscillator frequency and one 20th of a reference oscillator frequency of 10 MHz.

The above example uses local oscillator signals having frequencies which are lower than the input and first i.f frequencies respectively. Arrangements of one higher and one lower or two higher frequencies are also possible, still using the same division ratio between the two local oscillator frequencies. In other words, the relationship $X=(f/f_{LO2})-1$ holds true in each case.

It is possible, within the scope of the invention to choose common factors of the channel spacing and the reference oscillator frequency which are not the highest common factor. Thus, for example, the second local oscillator frequency may be incremented in steps of 31.25 KHz or 20.8333 KHz, with X equal to 17 or 26 respectively. However, these result in lower comparison frequencies, which has disadvantages as will become clear below.

By appropriate selection of a fixed value for the variable division ratio n, by switching in a different first i.f filter, by alteration of the comparison frequency, if required, and by changing the division ratio of the reference divider in the reference frequency source 38, the receiver of FIG. 1 can be used to receive GPS signals on the GPS L1 frequency of 1575.42 MHz.

The receiver described above with reference to FIG. 1 does have the disadvantage that the comparison frequency may not be sufficiently high to avoid limiting synthesiser switching speed undesirably. A higher comparison frequency is also preferable for reducing noise in the synthesiser loop, since loop noise is related to the ratio of the VCO frequency (the first local oscillator frequency) and the comparison frequency.

Figure 2:
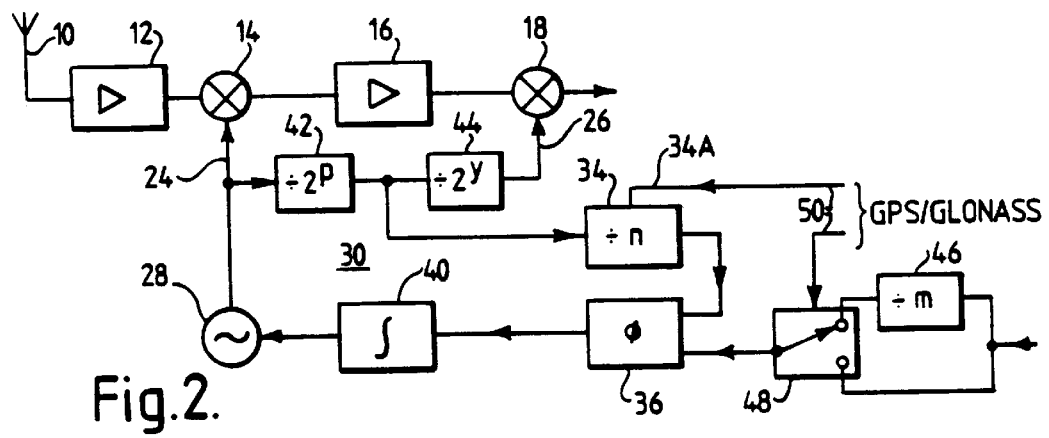
FIG. 2 is a block diagram of part of a second radio receiver in accordance with the invention.

However, it is possible to trade the bandwidth of the variable divider for frequency changing agility and synthesiser loop noise. Referring to FIG. 2, this is achieved by reducing the overall division ratio in the loop 30 by, for example, taking the input for the variable divider 34 from a point further "upstream" than in the loop of the previous example (shown in FIG. 1). Thus, the input to the variable divider 34 may be coupled to a "tap-off" point between the two fixed ratio dividers 42, 44 which together, perform the same function and have the same overall division ratio X as the single divider 32 in the previous example.

To take, again, the example of X=8, dividers 42 and 44 are binary dividers with division ratios $2^p$ and $2^y$ respectively, where p+y=3. It will be seen that if p=1, and the variable divider 34 is unchanged compared with the first example, the comparison frequency is raised from 62.5 KHz to 250 KHz. Indeed, it is possible to make p=0 and eliminate the divider 42 altogether so that the comparison frequency becomes 500 KHz.

However, whether the variable divider 34 takes its input from the end output of the fixed divider section, or from a "tap-off" point, or directly from the output of the VCO 28, the division ratio between the inputs 24, 26 of the mixers 14, 18 remains the same.

The example of FIG. 2 is particularly susceptible for use in a combined GPS/GLONASS receiver, because with p=0 and a comparison frequency of 0.5 MHz in the GLONASS mode, a 10 MHz reference frequency may be used with a simple reference divider 46 having a division ration m equal to 20. Interposing a switch 48 in the reference circuitry as shown to allow bypassing of the reference divider 46 enables the comparator 36 to be operated at 10 MHz in the GPS mode, the variable divider 34 being operated with a fixed division ratio of 128. Both the switch 48 and the divider 34 are controlled via control inputs 50 when switching between modes. This particular example produces a first i.f of 295.42 MHz in GPS mode and, therefore, needs different i.f filtering in the two modes. In some circumstances, frequencies and division ratios may be selected to avoid the need to change the first i.f filtering between modes.

Figure 3:
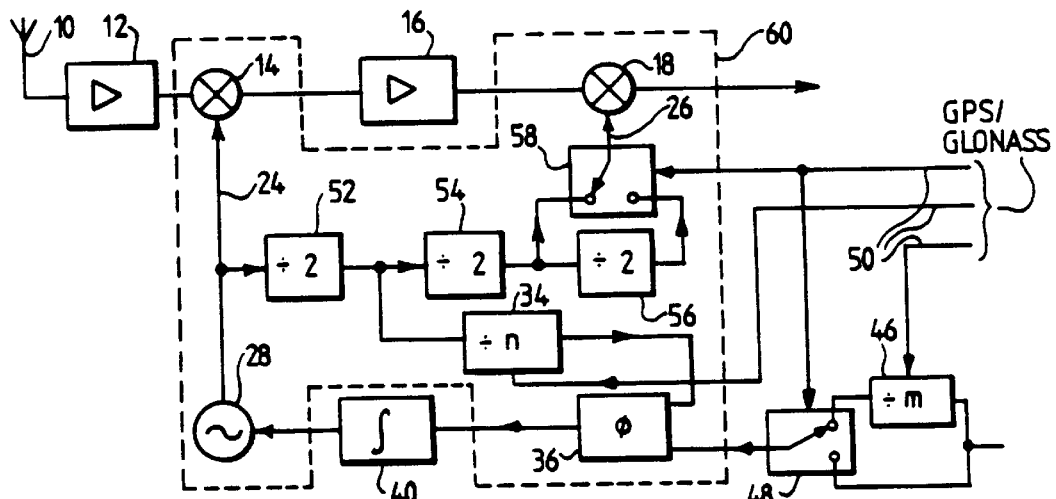
FIG. 3 is a block diagram of part of a third radio receiver in accordance with the invention.

Further possibilities can be realised by altering the division ratio of the divider feeding the second mixer 18 when switching to GPS mode, as shown in FIG. 3. Referring to FIG. 3, this divider is split into three parts 52, 54 and 56, each a simple binary divider dividing by 2. The input 26 to the second mixer 18 is taken from the output of divider 56 or from the output of divider 54 according to the position of a second electronic switch 58. In GLONASS mode, the switch 58 is operated to connect the mixer 18 to the output of divider 56 to give the required ratio of 8 between the first and second local oscillator signals. In GPS mode, the mixer is instead switched to the output of the divider 54 so that the ratio between the local oscillator signals is now 4. At the same time, as in the FIG. 2 embodiment, the reference divider 46 is bypassed to alter the comparison frequency, except that in this case the reference frequency and the division ratio m of the reference divider 46 are 40 MHz and 160 respectively. In GPS mode, the division ratio of the variable divider 34 is held at 16.

To minimise cost the receivers described above have been designed, as far as possible, to allow the majority of their components to be embodied in an integrated circuit or circuits. To take the example of FIG. 3, the dotted line 60 indicates some of the components that may be integrated on a chip. In practice, much of the reference source circuitry can also be "on chip" as well as some of the amplifier circuitry in the radio frequency and subsequent stages. The variable divider 34 can be "off-chip" if required, an option which is of particular interest if the chip is to be used as the basis of an integrated circuit which can be incorporated in the radio frequency stages of either a GPS receiver, or a GLONASS receiver, or a combined GPS/GLONASS receiver, since the GPS only receiver does not require the variable divider and a fixed ratio divider can be substituted.

The invention includes such an integrated circuit receiver or synthesiser chip as another aspect of the inventive concept, the chip including at least divider means operable to divide a first local oscillator signal by a fixed integer, preferably the integer 8, to produce a second local oscillator signal. The chip may include one or more of the other elements as shown in FIG. 3.

What is claimed is:

1. A superheterodyne radio receiver comprising
   a reference oscillator operable at a reference oscillator frequency,
   wherein, for tuning the receiver to a plurality of different receiving frequencies separated by the predetermined equal frequency spacing of a series of transmission channels;
   at least two successive frequency down-converters arranged to be fed by respective variable frequency local oscillator signal sources to produce an output signal at an output signal frequency, and
   a frequency synthesizer providing said signal sources, the reference oscillator being coupled to said synthesizer,
   wherein the frequencies of said signal sources vary with a constant integer multiple relationship such that they vary in proportion to each other, and
   wherein the frequency $f_{LO}$ of said source which feeds the down-converter producing the output signal varies in a series of frequency increments $\Delta f_{LO}$ associated with the equal frequency increments separating said receiving frequencies and equal to a factor common to said equal frequency spacing and said reference oscillator frequency, and
   wherein said frequency synthesizer is arranged such that the frequencies of said local oscillator signal sources are variable in respective increments the sum of which is equal to the predetermined frequency spacing.

2. A receiver according to claim 1, wherein said reference oscillator frequency is a multiple r of about 10 MHZ, where r=1, 2, 3, etc.

3. A receiver according to claim 1, wherein the synthesizer has a digital frequency divider having an input associated with one of said sources and an output forming another of said sources, said digital frequency divider comprising a plurality of binary divider portions connected in series, and having a fixed division ratio which remains constant as the receiver is tuned between channels.

4. A receiver according to claim 3, wherein said frequency synthesizer further comprises a variable divider having an input coupled to an output of said constant division ratio divider, a phase comparator having one input coupled to an output of said variable divider and another input coupled to said reference oscillator, and a variable frequency oscillator coupled to an output of said comparator.

5. A receiver according to claim 4, wherein said reference oscillator comprises a reference frequency divider, the receiver further comprising mode switching means associated with said reference frequency divider and said variable divider for allowing configuration of the receiver in one mode of operation as a fixed frequency receiver with a fixed synthesizer loop division ratio and with first reference and comparison frequencies and, in another mode of operation, as a variable frequency receiver with a variable synthesizer loop division ratio and with second reference and comparison frequencies.

6. A superheterodyne radio receiver comprising
   a frequency down-converter section having an input and an output and including at least two successive frequency down converters arranged to be fed by respective local oscillator signal sources, the output of the frequency down converter section having a carrier frequency,
   a frequency synthesizer providing said signal sources; and
   a reference oscillator coupled to said synthesizer, said reference oscillator being operable at a reference oscillator frequency,
   wherein, for tuning the receiver to a plurality of different receiving frequencies separated by the predetermined equal frequency spacing of a series of transmission channels, the frequencies of said local oscillator signal sources are variable in a respective series of frequency increments associated with said different receiving frequencies while having a constant integer multiple interrelationship such that the frequencies of the local oscillator signal sources vary in proportion to each other; and
   wherein said predetermined frequency spacing is integer divisible by the frequency increment of at least one of said local oscillator signal sources;
   and wherein the carrier frequency of the output of said frequency down-converter section is a constant.

7. A receiver according to claim 6, wherein said predetermined frequency spacing is integer divisible by only the frequency increment of the lowest frequency variable local oscillator signal source.

8. A receiver according to claim 6 wherein said frequency down-converter section has two frequency down-converters, and wherein the frequency synthesizer is arranged such that the frequency increments $\Delta f_{LO1}$ and $\Delta f_{LO2}$ of the local oscillator signal sources feeding the two down-converters are related by the expressions:

$$\Delta f_{LO1} + \Delta f_{LO2} = \Delta f$$

where $\Delta f$ is the said predetermined frequency spacing, and $$X = (\Delta f / \Delta f_{LO2}) - 1$$

where X is the ratio between the variable local oscillator frequencies.

9. A receiver according to claim 8, wherein the ratio X is equal to 8.

10. A receiver according to claim 6, wherein said variable frequency local oscillator signal sources are constituted by said frequency synthesizer, said synthesizer having a digital frequency divider which has an input associated with one of said sources and an output forming another of said sources.

11. A receiver according to claim 10, wherein said frequency divider, in at least one mode of operation of the receiver, is a fixed division ratio divider associated with a variable divider chain linking (a) a variable frequency oscillator having an input for variation of its frequency, and (b) a phase or frequency comparator for comparing an output signal of the divider chain with a reference signal the frequency of which is governed by the reference oscillator.

12. A receiver according to claim 10, wherein said digital frequency divider comprises a binary divider.

13. A receiver according to claim 10, wherein said reference frequency source includes a reference frequency divider, the receiver further including changeable modes of operation associated with the reference frequency divider and the variable divider for allowing configuration of the receiver either as a fixed frequency receiver with a fixed synthesizer loop division ratio and with first reference and comparison frequencies, or as a variable frequency receiver with a variable synthesizer loop division ratio and with second reference and comparison frequencies.

14. A superheterodyne tuner for shifting an input signal modulated on a carrier at one of a plurality of evenly spaced apart carriers to an intermediate frequency carrier, the tuner comprising:

a first and a second frequency down converter, each converter having two inputs and an output, a first input of the first converter being responsive to the input signal and a first input of the second converter being responsive to the output of the first converter;

a fixed frequency signal source;

an adjustable frequency divider for providing a first local oscillator input signal to the second input of the first converter and a second local oscillator input signal to the second input of the second converter, the frequency of the first local oscillator input signal being an integer multiple of the frequency of the second local oscillator signal; and a control to alter the frequency of the second local oscillator input signal in steps that are equal to the spacing between at least some of the channels divided by an integer greater than one;

wherein the frequency of the first local oscillator input signal is variable in corresponding steps, the sum of each step of the first local oscillator signal and each step of the second local oscillator signal being equal to said channel spacing.

15. A superheterodyne receiver for processing signals received in a plurality of receiving channels having different frequencies equally separated from each other by a predetermined frequency spacing, the superheterodyne receiver comprising:

a first frequency down-converter and a second frequency down-converter, each converter having two inputs and an output, a first input of the first converter being responsive to the input signal and a first input of the second converter being responsive to the output of the first converter;

a local oscillator generator providing two adjustable local oscillator (l.o.) signals, a first l.o. signal being provided to a first input of the first down converter and a second l.o. signal being provided to the second down converter, the frequency of the first l.o. signal being an integer multiple of the second l.o. signal;

a control circuit arranged to alter the first and second l.o. signals in frequency increments together so as to tune the receiver to different selected ones of said receiving channels and such that the output of the second down-converter is the signal received in any of said selected channels shifted to an intermediate frequency which is fixed as the receiver is tuned from channel to channel, said predetermined frequency spacing being integer divisible by said frequency increments in which the second l.o signal is altered.

16. A method for superhetrodyning a signal from one of plurality of first carrier frequencies for different channels with at least some of the first carrier frequencies being separated from the frequency of the carrier frequencies of adjacent channels are separated by predetermined equal channel spacing $\Delta F_{cs}$ to a predetermined single second carrier frequency, the method comprising:

frequency synthesizing first and second local oscillator signals having a changeable $LO_1$ and a changeable $LO_2$ frequency respectively with a fixed ratio X between the frequency of the first and second local oscillator frequencies from a reference signal for at least a plurality of the channels, wherein X is a positive number and wherein the frequencies of the first and second local oscillator signals are changeable to predetermined frequencies separated from adjacent predetermined frequencies in fixed steps of $\Delta LO_1$ and $\Delta LO_2$, respectively, wherein $\Delta LO_1 = \Delta LO_2 * X$ and $\Delta LO_1 + \Delta LO_2 = \Delta F_{cs}$;

selecting the specific channel to be superhetrodyned by adjusting the controllable element by selecting the appropriate predetermined frequencies of the first and second local oscillator signals;

downshifting the signal on the selected channel by combining the selected signal with the first local oscillator signal to produce a first IF signal;

downshifting the signal on the selected channel by combining the first IF signal with the second local oscillator signal to produce a second IF signal having a carrier at the second carrier frequency.

17. The method of claim 16, wherein the frequency synthesizing comprises:

frequency dividing the first local oscillator signal by X to produce the second local oscillator signal;

frequency dividing the second local oscillator signal by an adjustable quantity N to produce a divided signal, comparing either the phase or the frequency differences between the divided signal and the reference signal to produce comparison information;

averaging the comparison information to generate the first local oscillator signal.

18. The method of claim 16, wherein the frequency synthesizing further includes processing a signal on at least one additional channel and the signal on at least one additional channel is processed by changing the ratio of the frequencies between the first and second local oscillator signals.

19. The method of claim 16, wherein the frequency synthesizing comprises:

frequency dividing the first local oscillator signal by a quantity to produce a divided signal;

frequency dividing the first local oscillator signal by a quantity to produce the second local oscillator signal;

comparing either the phase or the frequency differences between the second divided signal and the reference oscillator to generate comparison information; and averaging the comparison information to generate the first local oscillator signal.

20. The method of claim 19, wherein the method further comprises:

selecting the reference signal from one of two signals each having a frequency, the frequency of one of the signals being a multiple of the second frequency.

21. The method of claim 19, wherein the dividing of the first local oscillator signal to produce the second local oscillator signal includes dividing the divided signal.

22. The method of claim 19, wherein by selecting between the reference signals and the selecting of the channel, the output of the superhetrodyning circuit is selected between a GLONASS signal and a GPS signal.

* * * * *